United States Patent
Seo

(10) Patent No.: US 6,898,223 B2
(45) Date of Patent: May 24, 2005

(54) APPARATUS FOR AND METHOD OF CONTROLLING OUTPUT OF A LASER DIODE

(75) Inventor: Jin-gyo Seo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 128 days.

(21) Appl. No.: 10/084,342

(22) Filed: Feb. 28, 2002

(65) Prior Publication Data

US 2002/0172242 A1 Nov. 21, 2002

(30) Foreign Application Priority Data

May 17, 2001 (KR) .......................................... 2001-26962

(51) Int. Cl.[7] .............................. H01S 3/00; H01S 3/13; G11B 11/00
(52) U.S. Cl. .............................. 372/38.02; 372/38.07; 372/38.1; 372/29.01; 372/38.01; 372/29.011; 372/29.02; 369/116
(58) Field of Search .......................... 372/38.02–38.06, 372/38.07, 38.1, 38.01, 29.01–33; 369/53.26, 116, 44.12

(56) References Cited

U.S. PATENT DOCUMENTS

| 4,685,097 A | * | 8/1987 | van der Put | 369/53.26 |
| 4,796,250 A | * | 1/1989 | Kobayashi et al. | 369/53.26 |
| 4,855,988 A | * | 8/1989 | Shinbayashi et al. | 369/116 |
| 5,111,447 A | * | 5/1992 | Yamashita et al. | 369/44.12 |
| 5,446,719 A | * | 8/1995 | Yoshida et al. | 369/116 |
| 5,991,325 A | * | 11/1999 | Ohtomo et al. | 372/38.02 |
| 6,222,814 B1 | | 4/2001 | Ichimura | 369/116 |

FOREIGN PATENT DOCUMENTS

| JP | 62149033 A | * | 7/1987 | ............ G11B/7/00 |
| KR | 1998-78070 | | 11/1998 | |
| KR | 10-0200819 | | 6/1999 | |

* cited by examiner

*Primary Examiner*—Minsun Oh Harvey
*Assistant Examiner*—Armando Rodriguez
(74) *Attorney, Agent, or Firm*—Staas & Halsey LLP

(57) ABSTRACT

An apparatus for and a method of controlling an output of a laser diode in an optical recording/reproducing apparatus. The apparatus includes a sampling circuit sampling a present power value output from the laser diode with a predetermined frequency, an arithmetic unit connected to the sampling circuit, outputting a control power value applied to the laser diode in response to the present power value output from the sampling circuit and a reference power value, and a controller connected to the sampling circuit and the arithmetic unit, generating control signals, which control the operations of the sampling circuit and the arithmetic unit.

15 Claims, 4 Drawing Sheets

APPARATUS FOR AND METHOD OF CONTROLLING OUTPUT OF A LASER DIODE

CROSS-REFERENCE TO RELATED APPLICATIONS

This application claims the benefit of Korean Application No. 2001-26962 filed May 17, 2001 in the Korean Patent Office, the disclosure of which is incorporated herein by reference.

BACKGROUND OF THE INVENTION

1. Field of the Invention

The present invention relates to an apparatus for and a method of controlling an output of a laser diode in an optical recording/reproducing apparatus, and more particularly, to an apparatus for and a method of controlling an output of a laser diode in accordance with a sampled signal of the output having a predetermined frequency.

2. Description of the Related Art

Various types of recording media having a great amount of data recording capacity have been developed for use in optical recording apparatuses, such as CD-R, CD-RW, Magnetic Optical Disc Drive (MODD), DVD-Digital Versatile Disc Random Access Memory (DVD-RAM), DVD-RW and DVD+RW. These optical recording apparatuses use a laser diode for reading data from and writing data onto the recording medium, and the performance of each optical recording apparatus depends on how well an output of the laser diode is controlled. In order to control the output of the laser diode at an optimum level, the shape of a write pulse must be accurately controlled because the shape of the write pulse is different depending on each type of the optical recording apparatus.

FIG. 1 is a block diagram of a general laser diode output control apparatus. Referring now to FIG. 1, a reference numeral 120 indicates a write waveform generator for generating a write pulse so as to form a space or mark corresponding to recording data on a disc 180. A reference numeral 140 denotes a laser diode driving unit for controlling an output of a laser diode 160 according to the write pulse generated in the write waveform generator 120. Here, the recording data input to the write waveform generator 120 is a non return-to-zero inverted (NRZI) signal, and the write pulse output from the laser diode driving unit 140 is a combination of a first pulse, a last pulse, a cooling pulse, and a multi-train pulse in the case of DVD-RAM.

An auto laser power controller (APC) 200 includes a photo diode (PD) 202, a variable gain amplifier (VGA) 204, a comparator 206, an up/down counter 208 and a digital-to-analog converter (DAC) 210.

The PD 202 receives light reflected from the disc 180 and generates an electrical signal corresponding to the gain of the received light. The VGA 204 amplifies the electrical signal with a predetermined gain and converts the amplified electrical signal into a voltage signal. The comparator 206 compares the voltage signal of the VGA 204 and a reference power value Vref and outputs a determination signal in response to the comparison between the voltage signal and the reference value Vref.

The up/down counter 208 counts up/down according to the determination signal output from the comparator 208. In detail, the up/down counter 208 counts down when the determination signal output from the comparator 206 is at a low level representing that the voltage signal of the VGA 204 is greater than the reference power value Vref. In contrast, the up/down counter 208 counts up when the determination signal is at a high level representing that the voltage signal of the VGA 204 is smaller than the reference power value Vref. The counted output signal of the up/down counter 208 is applied to the laser diode driving unit 140 via the DAC 210. The laser diode driving unit 140 controls an output level of the laser diode 160 according to the counted output signal applied to the DAC 210.

The APC circuit 200 shown in FIG. 1 detects a difference between the reference power value Vref and the present power value of the laser diode 160 detected by the PD 202 and controls an output level of the laser diode 160 according to the difference.

Since the conventional laser diode output control apparatus shown in FIG. 1 uses the up/down counter 208 for counting the voltage signal after the reference power value Vref is compared with the present power value, it is disadvantageous that the processing speed of the voltage signal cannot be increased with the up/down counter 208 and peripheral components as the reproducing and recording speed of the optical medium and the optical recording and reproducing apparatus increases. Moreover, the speed and the range of controlling the optical output of the laser diode are limited by a working speed of the up/down counter 208 since the up/down counter 208 processes the voltage signal at a constant speed regardless of the type of the optical medium and the reproducing and recording apparatus. Further, if the recording speed of the medium increases, the width of a write pulse is reduced. However, the up/down counter 208 cannot generate a counted signal for the reduced write pulse.

SUMMARY OF THE INVENTION

To solve the above problems, it is an object of the present invention to provide an apparatus for and a method of controlling a laser diode at a high speed and with a variable range of the speed.

It is another object to provide an apparatus for and a method of sampling a voltage signal representing an optical output of a laser diode, generating a sampling signal, and controlling the optical output of the laser diode with the sampling signal.

It is still another object to provide an apparatus and a method able to increase a processing speed of an optical output of a laser diode when the optical output is controlled.

It is yet another object to provide an apparatus and a method able to generate a variable control signal for dynamically controlling an optical output of a laser diode.

It is also an object to provide an apparatus for and a method able to control an optical output of a laser diode with a frequency which is determined depending on the type of an optical medium.

Accordingly, to achieve the above and other objects, there is provided an apparatus and a method of controlling a laser diode at a variable speed. The apparatus compares a present power value of an optical signal output from the laser diode with a reference power value and controls an output of the laser diode according to the comparison. The apparatus includes a sampling circuit for sampling the present power value output from the laser diode with a variable frequency, an arithmetic unit outputting a control power value applied to the laser diode based on the sampled present power value output from the sampling circuit and the reference power value, and a controller generating control signals, which control the operations of the sampling circuit and the arithmetic unit based on write data to be recorded.

The controller includes a write pulse generator generating power control signals based on a non-return to zero inverted (NRZI) signal and generating a write control signal indicating power applied to the laser diode based on the power control signals, a sampling controller generating a selection signal controlling the select operations of the sampling circuit and the arithmetic unit based on write control signals generated by the write pulse generator, and an APC controller controlling the operational mode of the laser output control apparatus.

Here, the sampling circuit further includes a preprocessor that controls the gain of a monitoring signal representing an output of the laser diode.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE PREFERRED EMBODIMENTS

Figure 1:
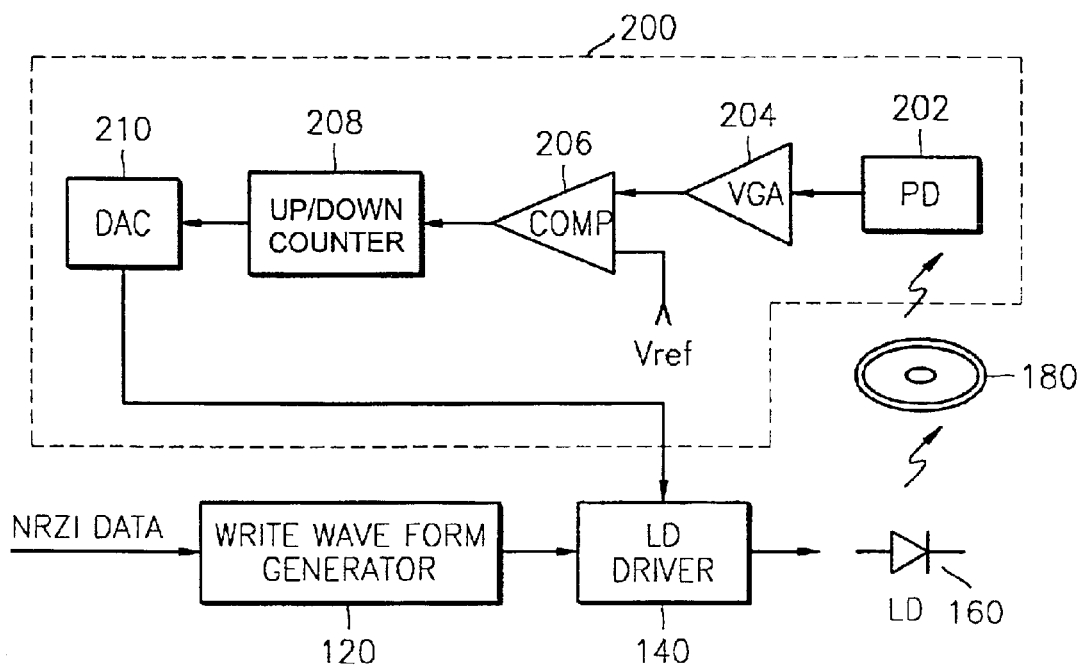
FIG. 1 is a block diagram of a general laser diode output control apparatus.

Reference will now be made in detail to the present embodiments of the present invention, examples of which are illustrated in the accompanying drawings, wherein like reference numerals refer to like elements throughout.

The laser diode output control apparatus shown in FIG. 1 uses an up/down counter and a comparator for making a comparison between a reference power value and a present power value and controlling an output of a laser diode according to the comparison. For this reason, there is a limitation in controlling the speed and range of an output of the laser diode. Further, as the recording speed of media increases, a recording pulse becomes shorter in length and complicated. Therefore, it is difficult to increase the recording speed of the recording apparatus with the up/down counter.

To solve these problems, the present invention provides an improved laser diode output control apparatus that samples and holds an output of a laser diode at a desired position for a desired period, compares the output of the laser diode with a reference power value, and controls the output of the laser diode.

Figure 2:
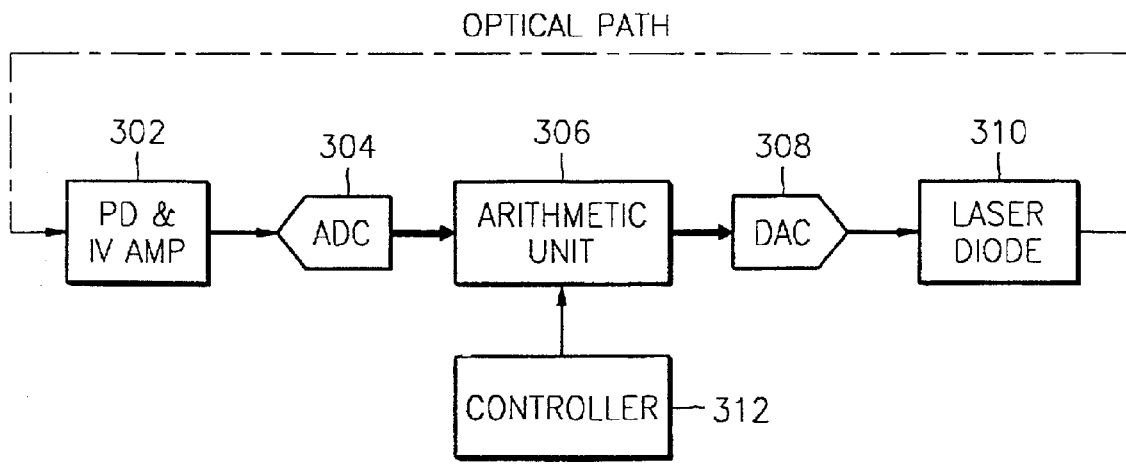
FIG. 2 is a block diagram of a laser diode output control apparatus according to an embodiment of the present invention.

FIG. 2 is a block diagram of a laser diode output control apparatus according to an embodiment of the present invention. Referring to FIG. 2, the apparatus includes a photo diode (PD) & current-to-voltage (I/V) amplifier 302, an analog-to-digital converter (ADC) 304, an arithmetic unit 306, a digital-to-analog converter (DAC) 308, a laser diode 310, and a controller 312.

The output of the laser diode 310 is determined by the output of the DAC 308. The PD & I/V amplifier 302 detects the level of the output and converts the output into a voltage signal.

The PD & I/V amplifier 302 has been usually manufactured on separate chips, but it is possible to combine a PD and an I/V amplifier on one chip. The output of the PD & I/V amplifier 302 indicates the present power value of a laser generated by the laser diode 310 and assumes the shape of a delayed write pulse output from the laser diode 310. Here, the amount of the delay between a write pulse of the laser diode 310 and the delayed write pulse varies depending on the operational characteristics of the laser diode 310 and the PD & I/V amplifier 302, but may be fixed once the laser diode output control apparatus is assembled.

The ADC 304 obtains the present power value by sampling the output of the PD & I/V amplifier 302 at a predetermined point of time and transmits the sampled present power value to the arithmetic unit 306. Although not illustrated in FIG. 2, a converter can be interposed between the ADC 304 and the PD & I/V amplifier 302. The operational characteristics of the PD & I/V amplifier 302 may be increased or decreased as the intensity of a laser varies. Thus, there is a possibility that a converter is needed to match the operational characteristics of the PD & I/V amplifier 302 with those of the ADC 304.

A level shifter and/or a gain adjustor may be connected between the PD & I/V amplifier and the ADC 304 to match the dynamic range of the ADC 304 with the output characteristics of the PD & I/V amplifier 302. The optical output of the laser diode and the output of the PD & I/V amplifier 302 may have a first frequency in response to the write pulse of the laser diode. The ADC 304 converts the output of the PD & I/V amplifier 302 into the present power value with a second frequency being greater than the first frequency. Therefore, the output of the laser diode may be controlled with a higher frequency than the write pulse of the laser diode.

The arithmetic unit 306 compares a reference power value and the sampled present power value sampled by the ADC 304 and controls the output of the laser diode 310 according to a difference between the reference power value and the present power value. Here, the reference power value may vary according to the type of a medium, a land/groove, the kind of a power control signal, and so on. As described above, the arithmetic unit 306 compares a reference power value and the present power value sampled by the ADC 304 and corrects a control power value with a difference between the sampled present power value and the reference power value, and therefore, is capable of controlling the output of the laser diode 310 faster than an up/down counter used in a conventional laser diode output control apparatus.

The DAC 308 transmits the control power value measured by the arithmetic unit 308 to the laser diode 310.

The controller 312 generates control signals for controlling operations of the ADC 304 and the arithmetic unit 306 based on recording data to be recorded, and further, controls the operations of the arithmetic unit 306 according to an operational mode.

Figure 3:
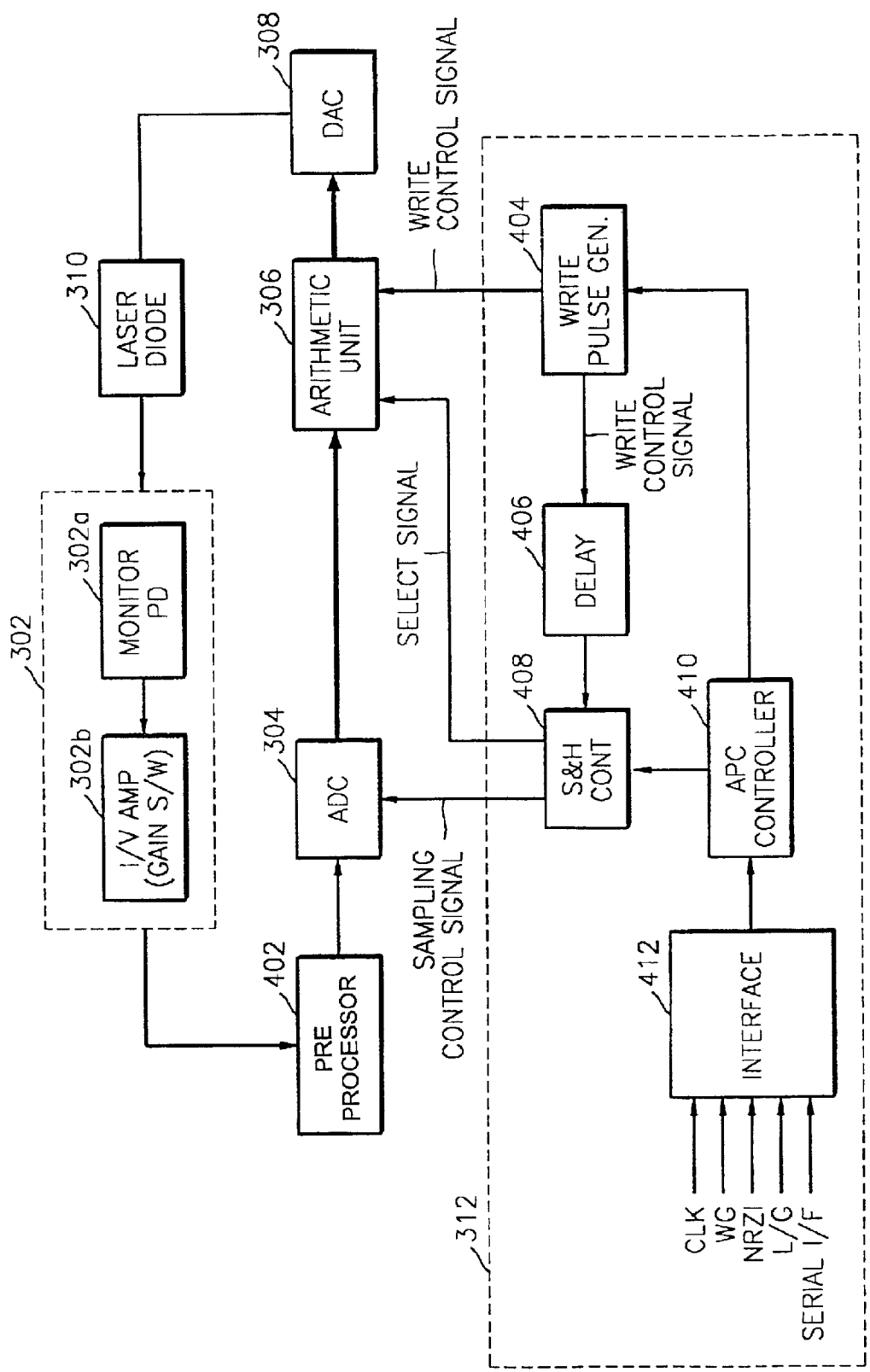
FIG. 3 is a block diagram showing a detailed structure of the laser diode output control apparatus shown in FIG. 2.

FIG. 3 is a block diagram showing a detailed structure of a laser diode output control apparatus according to the present invention. Referring to FIG. 3, the laser output control apparatus includes a PD & I/V amplifier 302 comprising an I/V amplifier 302b and a monitor PD 302a, an ADC 304, an arithmetic unit 306, a DAC 308, a laser diode 310, a preprocessor 402, a write pulse generator 404, a delayer 406, a sample & hold controller 408, an APC controller 410 and an interface 412.

The write pulse output from the laser diode 310 is a multi pulse including a first pulse, a multi-pulse train, a last pulse, a cooling pulse, and so on. Each pulse constituting the write pulse is at a specific of power level, such as a read power level, a peak power level, a first bias (or erase) power level, a second (or cooling) bias power level, or a third bias (or bottom) power level. The power level of the write pulse changes with time to become another specific power level.

The write pulse is generated based on a non return-to-zero inverted (NRZI) signal. In an adaptive recording method, a start/end position, a width, and a power level of each pulse are changed according to a relationship between spaces formed before and behind the present mark.

The write pulse generator 404 generates a write pulse by generating power control signals, i.e., a read power control signal, a peak power control signal, a first bias power control signal, a second bias power control signal, or a third power control signal, to turn on or off the power level of each write pulse and then generates a write control signal by delaying the power control signals and combining logics thereof. The kind of the power control signal generated by the write pulse generator 404 varies according to the type of the medium.

The arithmetic unit 306 outputs the power levels, such as a read power level, a peak power level, a first bias (or erase) power level, a second (or cooling) bias power level, and a third bias (or bottom) power level. The power levels output from the arithmetic unit 306 are sequentially applied to the DAC 308 by a write control signal generated by the write pulse generator 404.

In the case of a general type of a laser diode 310, a laser diode driver is attached thereto. Read power, peak power, first through third bias power, and power control signals are applied to the laser diode driver to control the power levels of the laser diode 310. Each power is set to on or off of the laser diode 310 by the corresponding power control signal, and the laser diode is driven according to a combination of the power levels made by turning each power on/off.

The write pulse generator 404 may include terminal pins, each outputting one of the power control signals to be applied to the laser diode driver. Through the write pulse generator 404, a read power level, a peak power level, a first bias (or erase) power level, a second bias (or cooling) power level, and a third bias (or bottom) power level, which are output from the arithmetic unit 306 and the DAC 308, are applied to the laser diode driver.

The ADC 304 samples the output of the PD & I/V amplifier 302 to obtain the present power value at a predetermined point in time and transmits the sampled present power value to the arithmetic unit 306.

The arithmetic unit 306 compares a reference power value and the present power value sampled by the ADC 304 and sets control power values applied to the laser diode 310, i.e., read power, peak power, and first through third bias power, according to a difference between the reference power value and the present power value. Here, the reference power value is supplied from the APC controller 410 when the laser diode output control apparatus shown in FIG. 3 is operated, and is changed depending on the type of the medium. The arithmetic unit 306 includes reference registers for storing reference power values, control registers for storing control powers applied to the laser diode 310, and a subtracter and an adder which measure a new control value using values stored in the reference registers and the control registers.

The write pulse generator 404 generates write pulse control signals, i.e., read power control signal, peak power control signal, and first through third bias power control signals, according to the type of media, an NRZI signal, and the relationship between a mark and spaces. Further, the write pulse generator 404 includes a plurality of delayers gates and generates a write control signal by delaying power level control signals generated and by measuring logics thereof.

Here, the write control signal selects one of the control power values stored in the control registers of the arithmetic unit 306.

In the write pulse, read power, peak power, first bias power, second bias power and third bias power appear sequentially along an axis of time, and sections of the write pulse are indicated by a read power control signal, a peak power control signal, a first bias power control signal, a second bias power control signal and a third bias power control signal, respectively. Thus, it is possible to measure each period of time during which each power is applied to a laser diode driver or controlled by combining the above power control signals with each other. The write pulse generator 404 combines the power control signals with each other and generates a write control signal indicating a respective section where each power must be applied to the laser diode 310.

The delay 406 delays a write control signal generated in the write pulse generator 404. An output of the PD & I/V amplifier 302 assumes the shape of the delayed write pulse applied to the laser diode 310. Here, the amount of the delayed write pulse varies depending on the operational characteristics of the laser diode 310 and the PD & I/V amplifier 302 and may be fixed when the laser diode output control apparatus is manufactured. The delay 406 delays a sampling operation of the ADC 304 to compensate for a delay due to the PD & I/V amplifier 302.

The sample and hold controller 408 generates a sampling control signal that controls the sampling operation of the ADC 304 with a write control signal delayed by the delay 406, and a selection signal that controls the operations of a multiplexer and a demultiplexer which are included in the arithmetic unit 306. The selection signal designates one of the sections in which a write pulse is divisionally indicated on an axis of time, where the sections denote periods of read power, peak power, first bias power, second bias power, and third bias power, which are applied to the laser diode driver.

The sampling control signal becomes a signal for controlling the sampling operation of the ADC 304, and sampling times are determined in sections in which read power, peak power, and first through third bias power are applied to the laser diode driver, respectively. For instance, a sampling time for sampling a read power can be alternatively selected in sections in which read power is applied, i.e., at a beginning part, a middle part or an end part. Further, the sampling time is determined by the delayed write control signals delayed from the write control signals or combined with logic levels thereof.

Here, the sample & hold controller 408 decreases the period of the write control signal generated by the write pulse generator 404 in half, in quarters and in eighths to adjust a loop time of the write control signal.

The APC controller 410 receives information from the interface 412 to control the operations of the sample & hold controller 408 and the write pulse generator 404 according to the type of a medium, a land/groove, and a selected control mode.

The interface 412 inputs a clock signal CLK, a read/write control signal WG, NRZI signal NRZI, and a land/groove determination signal L/G to the APC controller 410 and receives the type of a medium and various control information to be interfaced from an external micro processor.

The APC controller 410 processes values sampled by the ADC 304 according to a selected control mode and controls the sample & hold controller 408 to provide the processed values to the arithmetic unit 306. In the present invention, an average APC mode, a direct APC mode, a peak APC mode, and a bottom APC mode are suggested as one of the APC modes.

The APC operation of the laser diode 310 is controlled by an average value between the previous laser diode output value and the present laser diode output value in an average APC mode and controlled by an output of the present laser diode output value in a direct APC mode. In both the peak APC mode and the bottom APC mode, the APC operation is controlled by the present laser diode output value and a peak value or bottom value in a certain section.

In the laser diode output control apparatus shown in FIG. 3, the write pulse generator 404, the delay 406, and the sample & hold controller 408 may all be incorporated into one integrated circuit. Also, the preprocessor 402, the ADC 304, the arithmetic unit 306, the DAC 308, the APC controller 410 and the interface 412 may be formed on one integrated circuit.

The above devices of the laser diode output control apparatus are formed in the one integrated circuit so that the laser diode output control apparatus can be attached to a pickup device (not shown). Further, any disturbance occurring between elements can be prevented by forming the above devices in one integrated circuit, thereby effecting a stable laser output control operation. Particularly, in the case of high-capacity and high-speed optical recording/reproducing apparatuses, a signal exchanged between elements may have a high frequency. Such apparatuses are too sensitive to outside electrical disturbances and may easily malfunction. Malfunctions of the apparatus can be prevented by the devices being included in one integrated circuit.

Figure 4:
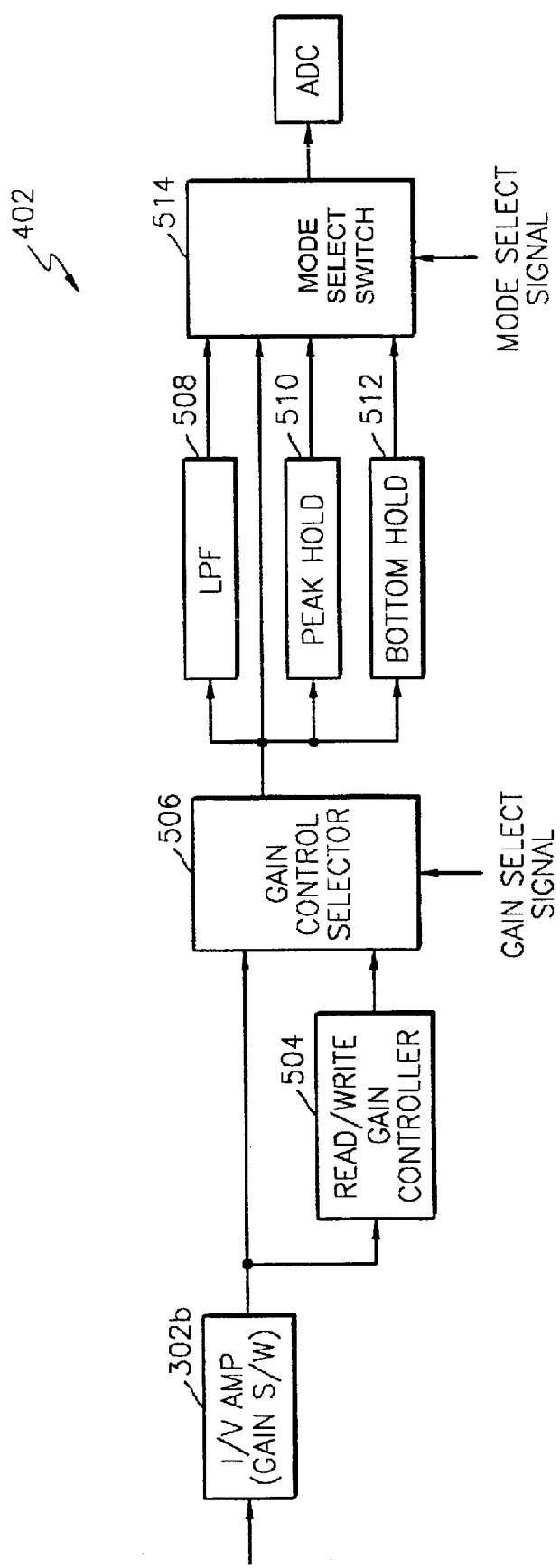
FIG. 4 is a block diagram of a preprocessor shown in FIG. 3.

FIG. 4 is a block diagram showing a detailed structure of the preprocessor 402 shown in FIG. 3. In FIG. 4, the preprocessor 402 includes a read/write gain controller 504, a gain control selector 506, a low-pass filter 508, a peak holder 510, a bottom holder 512, and a mode select switch 514.

The I/V amplifier 302b and the read/write gain controller 504 amplify a signal output from the PD & I/V amplifier 302 according to a given gain. Also, the I/V amplifier 302b and the read/write gain controller 504 adjust the gain to amplify the output of a monitor photo diode (PD) 302a according to a read mode or a write mode.

The gain control selector 506 is a switch for selecting one of the I/V amplifier 302b and the read/write gain controller 504 according to a gain selection signal applied from the APC controller 410.

The mode select switch 514 selects one of the signals provided by the low-pass filter 508, the gain control select switch 506, the peak holder 510, and the bottom holder 512 according to a mode select signal applied from the APC controller 410.

When the mode select signal indicates an average APC mode, the mode select switch 514 selects a signal provided by the low-pass filter 508 and outputs the same. The low-pass filter 508 averages the previous laser diode output value and the present laser diode output value and outputs the average value. When the mode selection signal indicates a direct APC mode, the mode select switch 514 selects a signal provided by the gain select switch 506 and outputs it. When the mode selection signal indicates a peak APC mode, the mode select switch 514 selects a signal provided by the peak holder 510 and outputs it. At this time, the peak holder 510 outputs the maximum value in a given section. Also, when the mode selection signal indicates a bottom APC mode, the mode select switch 514 selects a signal provided by the bottom holder 512 and outputs the signal. The bottom holder 512 outputs the minimum value in a given section.

The preprocessor 402 shown in FIG. 4 can be formed as an integrated circuit.

Figure 5:
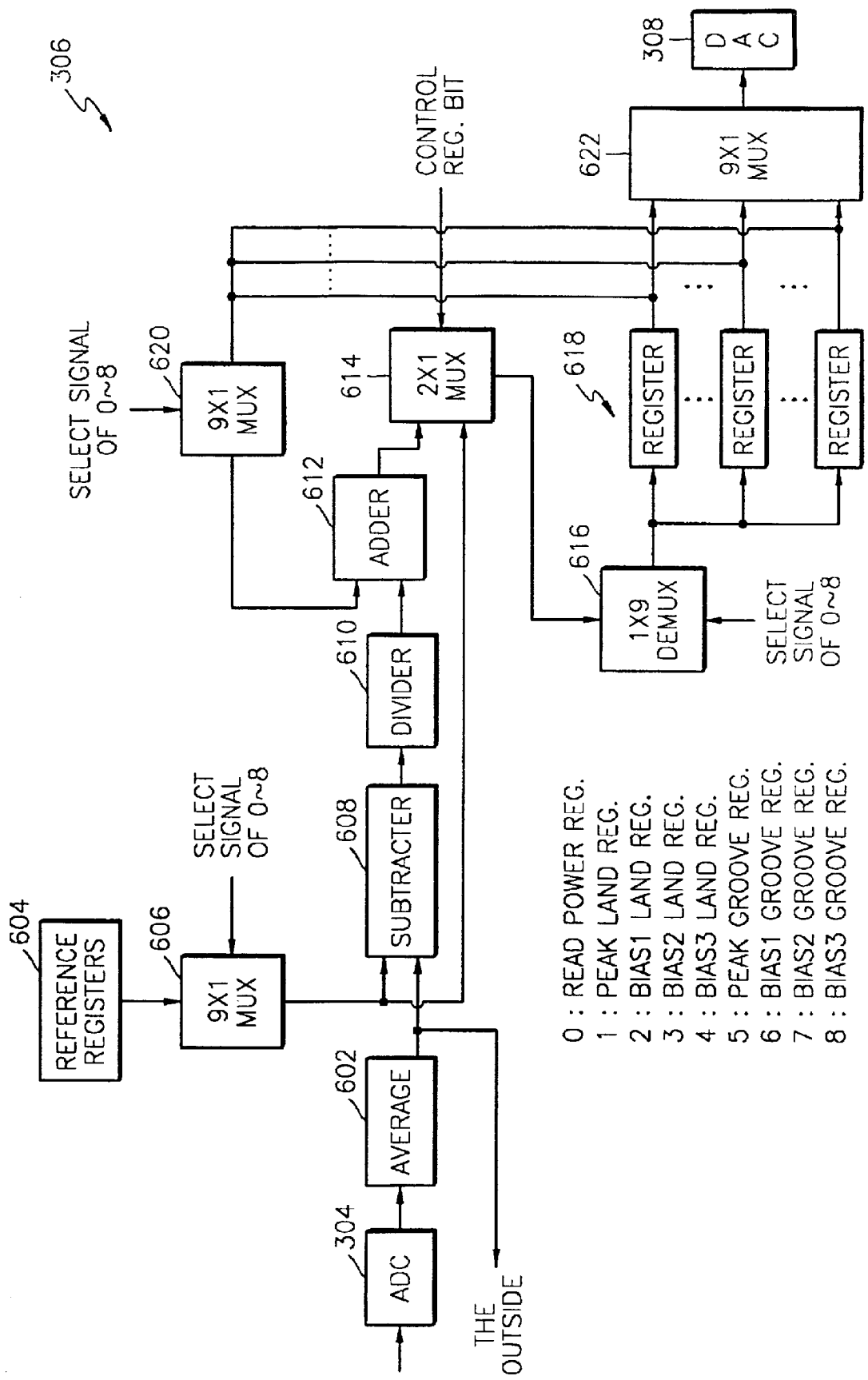
FIG. 5 is a block diagram of an arithmetic unit shown in FIG. 3.

FIG. 5 is a block diagram of the detailed structure of the arithmetic unit 306 shown in FIG. 3. Referring to FIG. 5, the arithmetic unit 306 includes an averaging unit 602, reference registers 604, a first multiplexer 606, a subtracter 608, a divider 610, an adder 612, a second multiplexer 614, a demultiplexer 616, control value registers 618, a third multiplexer 620, and a fourth multiplexer 622.

The averaging unit 602 removes sampling noise from the output of the ADC 304 and performs the low-pass filtering of the output of the ADC 304.

An output of the averaging unit 602 is sent to the subtracter 608 or an outside of the arithmetic unit 306 so that an external microprocessor can detect the output of the laser diode 310 during testing of the laser diode 310.

In the reference registers 604, a total of nine registers are included in the present invention. The reference registers 604 store reference power values, such as read power, peak power for a land, first through third bias power for the land, peak power for a groove, and first through third bias power for the groove. Here, the number of reference value registers may vary depending on the type of the medium and the number of power levels to be controlled.

Further, the apparatus shown in FIG. 5 may further include a multiplexer (not shown) for assigning reference power values to the reference registers 605. The APC controller 410 receives reference power values from the interface 412 and stores the same in the reference registers 604 with help from the multiplexer. Otherwise, the reference power values can be applied to the reference registers 604 directly from the multiplexer by the external microprocessor.

A first multiplexer 606 selects one of the reference registers 604. A subtracter 608 measures the difference between the reference power value output from the reference registers 604 and the present power values output from the averaging unit 602 and outputs the difference.

A divider 610 outputs a divided value of the difference measured by the subtracter 608, decreasing the difference, e.g., in half, in quarters, in eighths, and so on. As a result, the difference between the reference power value and the present power value obtained by the subtracter 608 can be reduced, thereby controlling the change of the difference to a target value.

A adder 612 adds the present power value provided by the laser diode 310 and the difference obtained by the divider 608 and outputs the added value. The output of the adder 612 is a value which later becomes a control power value to be supplied to the DAC 308 after being amended by the control registers 618, the and a third multiplexer 622.

A second multiplexer 614 is provided to store the reference power values in the reference registers 604 in the control registers 618 when the laser diode control apparatus is initialized. That is, at this time, the second multiplexer 614 stores a reference power value output from a reference register 604 that has been selected by the first multiplexer 606, in a control register selected by the demultiplexer 616. The second multiplexer 614 is selected by the APC controller 410.

A demultiplexer 616 selects the control registers 618 that store control values obtained from the adder 612.

The control registers 618 store the reference power values, which are provided to the laser diode 310, and includes nine registers that store read power, peak power for a land, first through third bias power for the land, peak power for a groove, and first through third bias power for the groove, respectively. Here, as with the reference registers 604, the number of the registers included in the control registers 618 may vary depending on the type of the medium and the number of the power levels to be controlled.

Although not shown, data input/output terminals may be included in the apparatus shown in FIG. 5 to provide or receive the control power levels stored in the control registers 618 to or from the external microprocessor. In this case, it is possible for the external microprocessor to detect the present control power values in the control registers 618 through the data input terminals and to store a predetermined control power value in the control registers 618 via the data input terminals. In conclusion, it is possible to control a laser diode output control apparatus as done by firmware.

The third multiplexer 620 selects one of the control power values to modify the power level.

A fourth multiplexer 622 selects one of the control power values to be applied to control the laser diode 310 when a write control signal generated by the write pulse generator 404 is input thereto.

In the apparatus shown in FIG. 5, the selecting of the first multiplexer 604, the demultiplexer 616, and the third multiplexer 620 must be synchronized with one another and are determined by a selection signal generated by the sampling controller 408. For instance, read power can be controlled by selecting both a reference register that stores the corresponding reference read power among the reference registers 604, and a control register that stores the corresponding control read power among the control registers 618.

The selection signal transmitted to the first multiplexer 604, the demultiplexer 616, and the third multiplexer 620, is generated by the sampling controller 408.

Hereinafter, the operations of a laser diode output control apparatus according to the present invention will be described in detail with reference to FIGS. 3 through 5.

During a test on the output of the laser diode 310, the output characteristics of the laser diode 310 is changed according to its working temperature. Thus, the characteristics of the laser diode must be considered prior to controlling the laser diode 310. To examine the output characteristics of the laser diode 310, predetermined control values are applied to the laser diode to measure outputs of the laser diode 310 corresponding to the predetermined control values. As a result, an output characteristics curve representing the output characteristics can be obtained with the control values and the output values.

During the above examination, an averaged output of the averaging unit 602 must be output to the outside, so that the output of the laser diode 310 can be input to the external microprocessor. The present power value of the laser output from the laser diode 310 is measured by applying a predetermined value to the ADC 304 via the external microprocessor so as to detect an output of the averaging unit 602.

Regarding the initial setting of an optical disc recording control apparatus, the control registers 618, which store control values to control the output of the laser diode 310, must be initialized to have predetermined values before the laser diode 310 is operated. At this time, the APC controller 410 controls the second multiplexer 614 to receive the output of the first multiplexer 606.

The operations of the first multiplexer 606 and the demultiplexer 616 are controlled by the selection signals generated by the sample & hold controller 408. For instance, when a selection signal indicates the read power, a reference register stores read power after being selected among the reference registers 604 by the first multiplexer 606, and a control register stores read power after being selected among the control registers 618 by the demultiplexer 616. That is, every time a selection signal indicates one of read power, peak power for a land, first through third bias power for the land, peak power for a groove, and first through third bias power for grooves, the corresponding control values are loaded into the control registers 618 from the reference registers 604.

In setting APC modes, a laser output control apparatus according to the present invention can be operated in an average APC mode, a direct APC mode, a peak APC mode and a bottom APT mode. An operational mode is selected among the operational modes by the APC controller 410.

The APC controller 410 controls the selecting of the multiplexer 514 shown in FIG. 4 and sets the operational mode of the apparatus. For instance, when a selection signal applied to the multiplexer 514 indicates an average APC mode, the multiplexer 514 selects the output of the low-pass filter 508.

In adjusting power levels, a signal to be selected is set by the first multiplexer 606 and the third multiplexer 620. The first and third multiplexers 606 and 620 are controlled by a selection signal generated by the sampling APC controller 410.

The subtracter 608 compares the output of the averaging unit 602, i.e., the present output value of the laser diode 310 with a reference power value provided by a reference register, which is selected by the first multiplexer 606, and measures a difference therebetween.

The difference measured by the subtracter 608 is decreased by the divider 610 and then is provided to the adder 612.

The adder 612 adds the difference obtained by the divider 610 with a control power value provided by the third multiplexer 620 and provides the result to the demultiplexer 616. The demultiplexer 616 selects a control register among the control registers 618 to store a value provided by the adder 612.

As described above, a laser diode output control apparatus according to the present invention enhances the performance of high-speed and large-capacity optical recording/reproducing apparatuses.

A method in the optical recording/reproducing apparatus includes generating a power level signal in accordance with the optical output of the laser diode 310, sampling the power level signal at a sampling frequency to generate a sampled signal, modifying the output of the laser diode 310 in response to the sampled signal to generate a second output from the laser diode 310. The method includes sampling and holding the output of the laser diode 310 at a predetermined position for a predetermined period of time. The method also includes generating a sampling control signal and a write control signal which is generated a predetermined period of time after the sampling control signal has been generated, sampling the power level signal in response to the sampling control signal, and generating the modified output from said laser diode in response to the write control signal and the sampled signal.

Also, it is possible to minimize the size of optical recording/reproducing apparatuses by incorporating a laser diode output control apparatus, which is formed as an integrated circuit, into a pickup.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for controlling an output of a laser diode in an optical medium apparatus, comprising:
    a sampling circuit sampling said output of said laser diode at a predetermined frequency according to a write pulse and generating a sampled signal;
    an arithmetic unit receiving said sampled signal, generating a control power value applied to the laser diode in response to said sampled signal, and modifying said output of said laser diode in response to said control power value; and
    a controller connected to said sampling circuit and said arithmetic unit, said controller including:
        a write pulse generator generating power control signals based on a non-return to zero inverted signal and generating a write control signal indicating power applied to said laser diode based on said power control signals; and
        a sampling controller connected to said write pulse generator, generating a selection signal, controlling said sampling circuit and said arithmetic unit based on said write control signals generated by said write pulse generator.

2. The apparatus of claim 1, further comprising a preprocessor interposed between said current/voltage converter and said analog to digital converter, controlling the gain of said voltage signal output from said current/voltage converter.

3. The apparatus of claim 2, wherein said preprocessor comprises:
    a read/write gain controller controlling the gain of said voltage signal output from said current/voltage converter in a read/write operational mode, generating a gain controlled power level signal; and
    a gain select switch selecting either one of said voltage signal of said current/voltage converter and said gain controlled power level signal of said read/write gain controller, and generating a gain controlled output signal and providing the selected output to said analog/digital converter].

4. The apparatus of claim 3, wherein said preprocessor comprises:
    a low-pass filter filtering said gain controlled output signal of said gain select switch, generating a low-pass filter signal;
    a peak holder holding a peak value from said gain controlled output signal of said gain select switch, and generating a peak holding signal;
    a bottom holder holding a bottom value from said gain controlled output signal of said gain select switch, and generating a bottom holding signal; and
    a mode select switch connected to said gain select switch, said low pass filter, said peak holder, and said bottom holder, selecting one of said gain controlled output signal, said low-pass filter signal, said peak holding signal, and said bottom holding signal, and providing the selected output to the analog/digital converter.

5. The apparatus of claim 1, further comprising a delay delaying said write control signal transmitted from said write pulse generator to said sampling controller and providing said sampling controller with a delayed write control pulse, and controlling said sampling controller to generate said selection signal in accordance with said delayed write control signal.

6. The apparatus of claim 1, further comprising:
    an interface connected to an external source, receiving interface signals including a clock signal, a read/write control signal, said NRZI signal and a land/groove determination signal; and
    an APC controller connected between said interface and said write pulse generator and said sampling controller controlling said write pulse generator and said sampling controller in response to said interface signals.

7. The apparatus of claim 1, wherein said arithmetic unit comprises:
    a reference power selector having reference registers storing reference power values, and generating a reference power value so as to control a selected power value of said output of said laser diode;
    a control power selector having control registers storing control power values, generating a control power value;
    a subtracter connected to said sampling circuit and said reference power selector, measuring a difference between said reference power value and said power values provided by said sampling circuit, generating a difference signal;
    an adder connected to said control power selector and said subtractor, adding said difference signal to said control power value, and generating an added signal; and
    a demultiplexer connected to said adder, selecting one of said control registers so as to store said added signal in said one of said control registers.

8. The apparatus of claim 7, further comprising a divider connected between said subtracter and said adder, said divider reducing said difference signal by a predetermined amount and providing a reduced difference signal to said adder.

9. The apparatus of claim 7, further comprising an averaging unit averaging said sampled signal of said sampling circuit and providing an average control signal to said subtracter, said subtracter generating said difference signal in response to said average control signal and said reference power value.

10. The apparatus of claim 9, wherein said average power value control signal of said averaging unit is transmitted to a micro processor.

11. The apparatus of claim 7, further comprising:
    a controller generating a selection signal;
    said reference power selector comprising:
        a first multiplexer selecting one of said reference registers, and
        a second multiplexer selecting one of said control registers and providing said control power value stored in said one of said control registered to said adder, wherein said first and second multiplexers and said demultiplexer are synchronized by said selection signal generated by said controller.

12. The apparatus of claim 11, further comprising:
    a third multiplexer connected to said control registers, selecting one of said control registers according to a write control signal generated from said controller; and a digital/analog converter connected to said third multiplexer, converting an output of said third multiplexer into an analog signal and providing said analog signal to said laser diode.

13. The apparatus of claim 11, further comprising a data output terminal connected to said control power selector, outputting said selected control power value stored in said selected control register to an outside of said arithmetic unit.

14. The apparatus of claim 11, further comprising a data input terminal connected to said control power selector, said control power value being stored in said selected control register when transmitted to said control power selector through said data input terminal.

15. The apparatus of claim 14, further comprising a fourth multiplexer connected between said adder and said control power selector, generating said control power value in response to one of said reference power value and said added signal, said control power selector storing one of said reference power value and said added signal in one of said control registers.

* * * * *

UNITED STATES PATENT AND TRADEMARK OFFICE
CERTIFICATE OF CORRECTION

PATENT NO. : 6,898,223 B2 Page 1 of 1
DATED : May 24, 2005
INVENTOR(S) : Jin-Gyo Seo It is certified that error appears in the above-identified patent and that said Letters Patent is hereby corrected as shown below:

Column 11,
Line 49, change "converter]." to -- converter. --.

Column 12,
Line 33, change "subtractor" to -- subtracter --.

Signed and Sealed this

Twenty-eighth Day of March, 2006

JON W. DUDAS
*Director of the United States Patent and Trademark Office*